(12) United States Patent
Abdesselam

(10) Patent No.: US 12,047,057 B2
(45) Date of Patent: Jul. 23, 2024

(54) DRIVER FOR INSULATED GATE TRANSISTOR WITH CIRCUIT FOR COMPENSATING FOR TIME DELAYS

(71) Applicant: THALES, Courbevoie (FR)

(72) Inventor: Francis Abdesselam, Chatou (FR)

(73) Assignee: THALES, Courbevoie (FR)

(*) Notice: Subject to any disclaimer, the term of this patent is extended or adjusted under 35 U.S.C. 154(b) by 0 days.

(21) Appl. No.: 18/116,220

(22) Filed: Mar. 1, 2023

(65) Prior Publication Data
US 2023/0283272 A1 Sep. 7, 2023

(30) Foreign Application Priority Data
Mar. 2, 2022 (FR) ........................................ 2201807

(51) Int. Cl.
*H03K 17/04* (2006.01)
*H03K 17/042* (2006.01)
*H03K 19/003* (2006.01)

(52) U.S. Cl.
CPC . *H03K 17/04206* (2013.01); *H03K 17/04213* (2013.01); *H03K 19/00323* (2013.01)

(58) Field of Classification Search
CPC .............. H03K 17/04; H03K 17/042; H03K 17/04206; H03K 17/04213; H03K 17/08; H03K 17/082; H03K 17/0822; H03K 17/0826; H03K 17/14; H03K 17/145; H03K 17/56; H03K 17/567; H03K 17/60; H03K 17/687; H03K 19/003; H03K 19/00307; H03K 19/00315; H03K 19/00323; H03K 19/00369; H03K 19/00376; H03K 19/00384
See application file for complete search history.

(56) References Cited

U.S. PATENT DOCUMENTS

| | | | |
|---|---|---|---|
| 2011/0273206 A1* | 11/2011 | Lee ..................... | H03K 17/163 327/109 |
| 2017/0179944 A1 | 6/2017 | Ngo et al. | |
| 2023/0146986 A1* | 5/2023 | Abdesselam .... | G01R 19/16547 361/86 |

FOREIGN PATENT DOCUMENTS

| | | |
|---|---|---|
| JP | 11-262243 A | 9/1999 |
| JP | 5-736243 B2 | 6/2015 |

* cited by examiner

*Primary Examiner* — Long Nguyen
(74) *Attorney, Agent, or Firm* — BakerHostetler

(57) ABSTRACT

A power stage includes a power transistor and a driver, the power transistor comprising a collector, a gate and an emitter and being configured to change over from a saturated state to an off state and vice versa in accordance with a control from the driver, the power stage comprising a resistor Rg positioned between the driver and the gate, the power stage comprising a circuit for compensating for delays that is positioned in parallel with the resistor Rg, comprising: a circuit for compensating for turn-on initialization delays, which is configured to divert the current from the resistor Rg when a saturation of the power transistor is initialized, a circuit for compensating for turn-off initialization delays, which is configured to divert the current from the resistor Rg when a switching-off of the power transistor is initialized, a circuit for compensating for delays that is configured to divert the current from the resistor Rg when the power transistor is close to the saturated state.

7 Claims, 5 Drawing Sheets

DRIVER FOR INSULATED GATE TRANSISTOR WITH CIRCUIT FOR COMPENSATING FOR TIME DELAYS

CROSS-REFERENCE TO RELATED APPLICATION

This application claims priority to foreign French patent application No. FR 2201807, filed on Mar. 2, 2022, the disclosure of which is incorporated by reference in its entirety.

FIELD OF THE INVENTION

The field of the invention is that of power electronics module controls that can be used to drive the operation of power electronics components. As is known, the power modules comprise electronic components handling high powers and therefore pay particular attention to their design and their tracking throughout their life and use.

BACKGROUND

More specifically, the invention deals with controlling power electronics components and with managing the delay between a control transmitted by a driver of the power electronics component and the response of the power component to the transmitted control.

As is known, the initialization of a turning-off of a power electronics component or the initialization of a turning-on of this power electronics component is not immediate following transmission of this control from the associated driver. This is because a power electronics component requires a certain time in order to charge or discharge, for example, or in order to induce the voltage needed for the gate of the power electronics component in keeping with the control transmitted by the driver. Consequently, delays can be observed, for example related to the charging or discharging of the power electronics component. As a result of its controlling the turning-off or turning-on of the power electronics component, for example, a control from the driver also causes an increase or decrease in the voltage and in the current going through the power electronics component. Now, the variations in the voltage and current that ensue are, at least partly, dependent on the time needed for the power component to respond to the control presented to it. Consequently, reducing the delay needed for the response by the power electronics component following a control from the driver increases the variation in the current and voltage to which the power electronics component is subjected. Too great a voltage and/or current variation can damage the power electronics component or even destroy it. Consequently, managing, and in particular compensating for, the delay by the power component following a control while not or barely affecting the variation in the current and voltage to which the power component is subjected when the control is initialized is a sizeable problem.

FIG. 1 shows a power station 2 comprising a driver 4 and a power transistor 6 driven by the driver 4. The power transistor 6 is a semiconductor component composed of three terminals: a collector c, an emitter e and a gate g connected to the driver 4. The power transistor 6 is an insulated gate bipolar transistor (IGBT). As a variant, the power transistor 6 is a field-effect transistor (metal oxide semiconductor field-effect transistor or MOSFET) and therefore comprises a drain, a source and a gate connected to the driver 4. Consequently, for a field-effect transistor, the drain can be likened to the collector c, the source can be likened to the emitter e. Generally, the management of the delays between the transmission of the control from the driver 4 and the reaction, for example the initialization of the turning-off or the turning-on, of the power transistor 6 is not taken into consideration and only a resistor of the gate Rg is positioned between the driver 4 and the gate g of the power transistor 6.

It is thus envisaged, as shown in FIG. 2, in order to reduce the increase in the voltage and the decrease in the current going through the power electronics component when the power transistor 6 turns off, for example, that:

a first conducting diode D1 and a first capacitor C1, both in parallel, that is to say forming two distinct electrical loops, one in relation to the other, be positioned in parallel with the resistor of the gate Rg. Conducting diode is understood to mean that the diode lets through the current, when the anode of the diode is facing in the direction of the current, towards the gate g of the power transistor 6. This is because, since the first capacitor C1 needs to be charged, a large voltage difference can be observed between the voltage for the control and the voltage across the first capacitor C1. Consequently, a current diverted from the resistor of the gate Rg can be observed with a redirection of the current, from the driver, to the first capacitor C1 and to the first conducting diode D1. The current diverted from the resistor of the gate Rg is effective until the first capacitor C1 is completely charged. Consequently, the first capacitor C1 turns into a switch that is off and the diverted current disappears.

a second conducting diode D2 be positioned in series with a second capacitor C2 connecting the collector c to the gate g of the power transistor 6. Moreover, a second resistor R2 is positioned in parallel with the second conducting diode D2.

It is also possible to reduce the decrease in the voltage and the increase in the current going through the power electronics component when the power transistor 6 turns on by exchanging the first diode D1, which is on, and the second diode D2, which is on, for diodes that are off, that is to say diodes preventing the current from flowing towards the gate g of the power transistor 6, when the cathode of the diode is facing in the direction of the current.

Nevertheless, these solutions have delays that are inherent in the first order, in the capacitive equivalent of the power transistor, and linked to the turning-off and/or the turning-on of the power electronics component.

This is because when the power transistor turns off or turns on, delays can be identified:

A time t1 between the turn-off control transmitted by the driver and the decrease in the voltage at the collector of the power transistor Vc.

A time t2 to observe the saturation of the insulated gate power transistor.

A time t3 associated with the increase in the voltage at the gate Vg to reach the maximum value Vgmax imposed by the control of the driver 4.

A time t4 between the turn-on control transmitted by the driver and the increase in the voltage at the collector of the power transistor Vc.

A time t5 to observe the delay in the desaturation of the power transistor.

A time t6 associated with the decrease in the voltage at the gate Vg to reach the minimum value Vgmin imposed by the control from the driver 4.

A time tf that represents the time needed for the decrease in the voltage at the collector Vc, that is to say the change from a voltage equivalent to 90% of the maximum voltage at the collector Vcmax to a voltage equivalent to 10% of the maximum voltage of the collector Vcmax.

A time tr that represents the time needed for the increase in the voltage at the collector Vc, that is to say the change from a voltage equivalent to 10% of the maximum voltage of the collector Vcmax to a voltage equivalent to 90% of the maximum voltage at the collector Vcmax.

The times t1, t2, t3, t4, t5, t6 are shown in FIG. 7.

Thus, when a turning-off of the power transistor is initialized, the times t1, tf, t2 and t3 are successive, significantly increasing the time needed for initializing the turning-off of the power transistor. Similarly, the times t4, t5, tr and t6 are also successive when the power transistor turns on.

SUMMARY OF THE INVENTION

The invention aims to overcome all or some of the problems cited above by proposing a device for compensating for the pure delays related to the initialization of the power transistor in response to a control from the driver that also has the advantage of not modifying and/or causing a rapid variation in voltage and/or current that can damage the power transistor. More specifically, the invention can be used to reduce the times t1, t2, t3, t4, t5 and t6 without affecting the times tf and tr, allowing the same variations in voltage and current to be preserved and electromagnetic interference not to be increased.

To this end, the subject of the invention is a power stage comprising a power transistor and a driver, the power transistor comprising a collector, a gate and an emitter, the power transistor being configured to change over from a state referred to as saturated to a state referred to as off and vice versa in accordance with a control from the driver, the power stage comprising a resistor Rg positioned between the driver and the gate of the power transistor, the power stage comprising a circuit for compensating for delays that is positioned in parallel with the resistor Rg, the circuit for compensating for delays comprising:
- a circuit for compensating for turn-on initialization delays, which is configured to divert the current from the resistor Rg when a saturation of the power transistor is initialized,
- a circuit for compensating for turn-off initialization delays, which is configured to divert the current from the resistor Rg when a switching-off of the power transistor is initialized,
- a circuit for compensating for delays that is configured to divert the current from the resistor Rg when the power transistor is close to the saturated state.

According to one aspect of the invention, the circuit for compensating for turn-on initialization delays comprises:
- a first signal diode configured to receive by way of its anode a control signal from the driver,
- a first signal transistor connected to the cathode of the signal diode via an emitter of the first signal transistor, the signal transistor comprising a base and a collector connected to the gate of the power transistor,
- a first resistor, connected to the emitter of the first signal transistor and to the base of the first signal transistor,
- a first signal capacitor connected to the base of the first signal transistor and to the gate of the power transistor.

According to one aspect of the invention, the first signal transistor is a PNP bipolar transistor.

According to one aspect of the invention, the first signal transistor is a P-channel MOSFET transistor.

According to one aspect of the invention, the circuit for compensating for turn-off initialization delays comprises:
- a second signal transistor connected to the gate of the power transistor via a collector of the second signal transistor, the second signal transistor comprising a base and an emitter,
- a second signal diode connected by way of its cathode to the driver and by way of its anode to the emitter of the second signal transistor,
- a second resistor, connected to the emitter of the second signal transistor and to the base of the second signal transistor,
- a second signal capacitor connected to the gate of the power transistor and to the base of the second signal transistor.

According to one aspect of the invention, the second power transistor is an NPN bipolar transistor.

According to one aspect of the invention, the second power transistor is an N-channel MOSFET transistor.

According to one aspect of the invention, the circuit for compensating for delays related to the charging and/or discharging of the power transistor comprises:
- a third signal diode configured to receive by way of its anode a control signal from the driver,
- a third signal transistor connected to the cathode of the third signal diode via an emitter of the third power transistor, the third signal transistor comprising a base and a collector connected to the gate of the power transistor,
- a third resistor connected to the base of the third signal transistor and to the emitter of the third signal transistor,
- a diode connected by way of its cathode to the collector of the power transistor and by way of its anode to the base of the third signal transistor via a third signal capacitor and a fourth resistor, the third signal capacitor and the fourth resistor being positioned in parallel with one another.

BRIEF DESCRIPTION OF THE DRAWINGS

The invention will be better understood and other advantages will become apparent on reading the detailed description of an embodiment provided by way of example, a description that is illustrated by the appended drawing, in which.

For the sake of clarity, the same elements will bear the same reference signs in the various figures.

DETAILED DESCRIPTION

Figure 3:
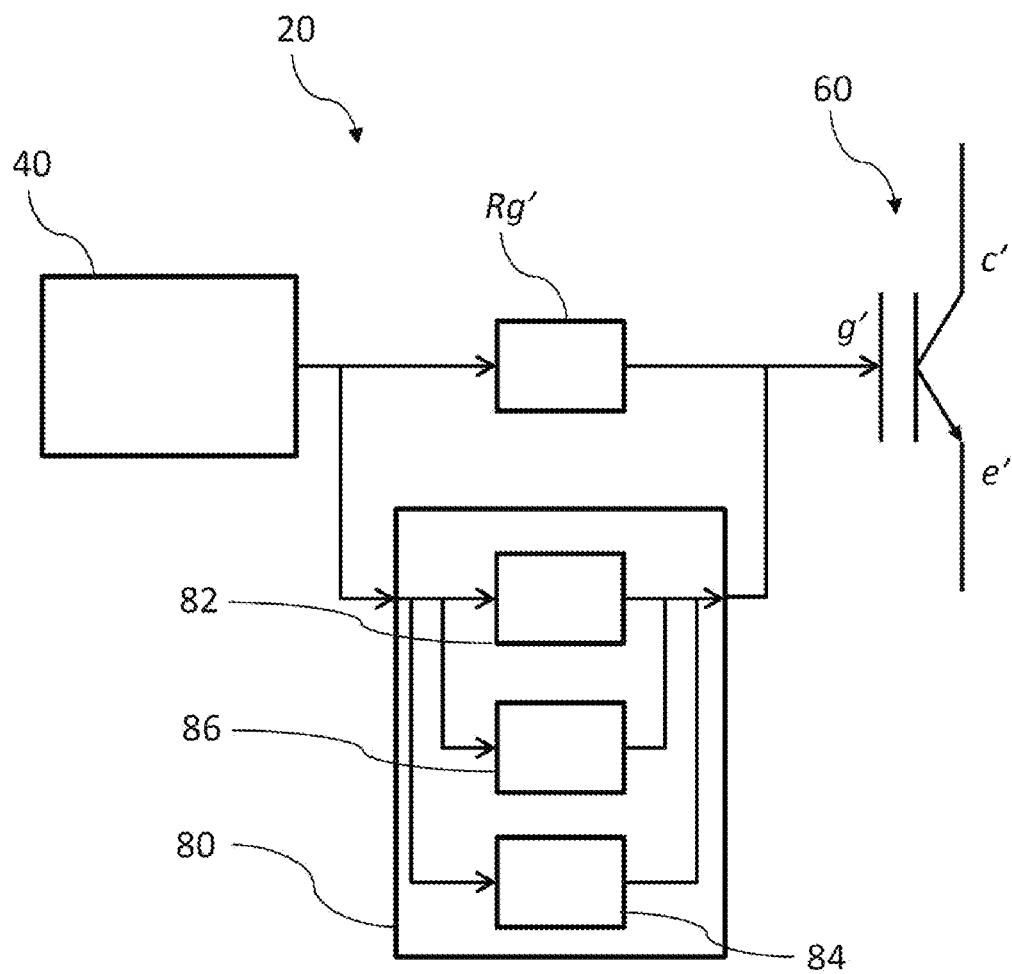
FIG. 3 shows a power stage comprising a driver, a power transistor and a circuit for compensating for delays related to the initialization of the power transistor according to the invention.

FIG. 3 shows a power stage 20 according to the invention, comprising a power transistor 60 and a driver 40. The power transistor 60 is an insulated gate bipolar transistor and comprises a collector c', an emitter e' and a gate g'. The power transistor 60 is configured to change over from a state referred to as saturated to a state referred to as off, and vice versa, according to a control from the driver 40. The power stage 20 also comprises a resistor Rg' positioned between the driver 40 and the gate g' of the power transistor 60.

The power stage 20 comprises a circuit for compensating for delays 80 that is positioned in parallel with the resistor Rg' comprising a circuit for compensating for turn-on initialization delays 82, which is configured to divert the current from the resistor Rg' when a saturation of the power transistor 60 is initialized. The circuit for compensating for turn-on initialization delays 82 can thus be used to limit the time related to the initialization of a turning-off of the power transistor 60 and specifically the times t1 and/or t3.

The compensation circuit 80 also comprises a circuit for compensating for turn-off initialization delays 84, which is configured to divert the current from the resistor Rg' when a switching-off of the power transistor 60 is initialized. The circuit for compensating for turn-off initialization delays 84 thus has the advantage of reducing the time related to the initialization of a turning-on of the power transistor 60 and specifically the times t4 and/or t6. Moreover, the circuit for compensating for turn-off initialization delays 84 is positioned in parallel with the circuit for compensating for turn-on initialization delays 82.

Moreover, the circuit for compensating for delays 80 comprises a circuit for compensating for delays 86 that is configured to divert the current from the resistor Rg' when the power transistor 60 is close to the saturated state, that is to say for a voltage less than 10 volts, and to reduce the times t2 and/or t5. The circuit for compensating for delays 86 is also positioned in parallel with the circuit for compensating for turn-on initialization delays 82 and the circuit for compensating for turn-off initialization delays 84.

Figure 4:
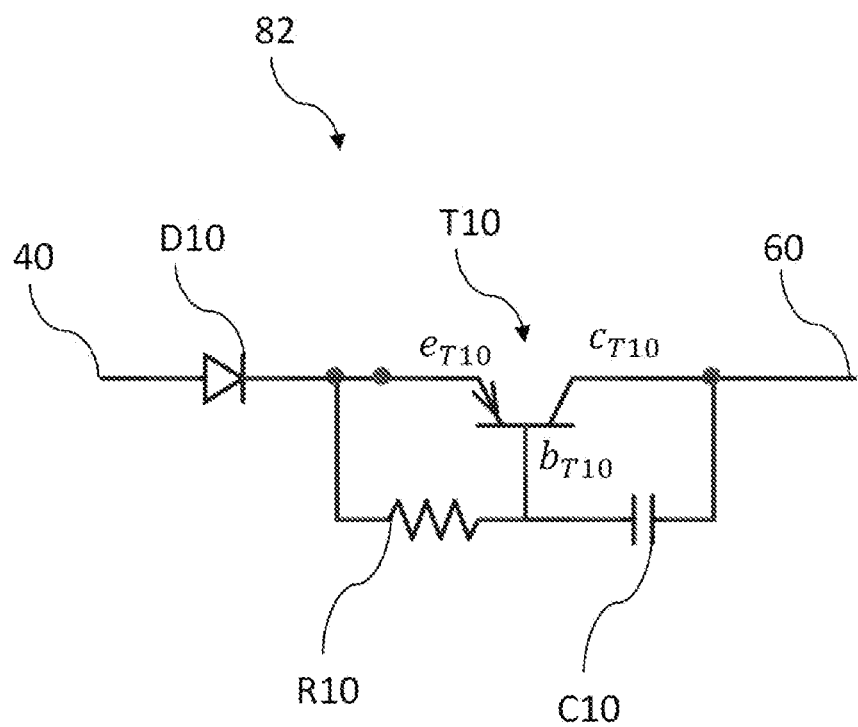
FIG. 4 shows an architecture for a circuit for compensating for turn-on initialization delays of the circuit for compensating for delays of the power transistor according to the invention.

In order to limit the time t1 between the initialization of the turning-off of the power transistor by the control from the driver and the decrease in the voltage at the collector of the power transistor Vc and the time t3 associated with the increase in the voltage at the gate Vg to reach the maximum value Vgmax imposed by the control from the driver 40, the circuit for compensating for turn-on initialization delays comprises, as shown in FIG. 4:

a first signal diode D10 configured to receive, by way of its anode, a control signal from the driver 40. The first signal diode D10 is on vis-à-vis the direction of the current towards the gate g' of the power transistor 60.

The circuit for compensating for turn-on initialization delays 82 comprises a first signal transistor T10 connected to the cathode of the first signal diode D10 via an emitter $e_{T10}$ of the first signal transistor T10. The signal transistor T10 also comprises a base $b_{T10}$ and a collector $c_{T10}$, which is connected to the gate g' of the power transistor 60.

The circuit for compensating for turn-on initialization delays 82 also comprises a first resistor R10, connected to the emitter $e_{T10}$ of the first signal transistor T10 and to the base $b_{T10}$ of the first signal transistor T10, and a first signal capacitor C10 connected to the base $b_{T10}$ of the first signal transistor and to the gate g' of the power transistor 60.

The first diode D10 thus allows the current from the driver 40 to flow in a single direction, towards the gate g' of the power transistor 60.

The first signal transistor T10 is a PNP bipolar transistor. As such, the current from the driver 40 passes through the first signal diode D10 before being directed towards the emitter $e_{T10}$ of the first signal transistor T10. Now, as the first signal capacitor C10 is discharged, a large voltage differential can be observed between the plate of the first signal capacitor C10 facing the current in the direction of the current, that is to say towards the gate g' of the power transistor 60, and the driver 40. Consequently, the current is directed towards this plate of the capacitor C10 and thus passes through the emitter $e_{T10}$ and the base $b_{T10}$ of the first signal transistor T10.

Figure 1:
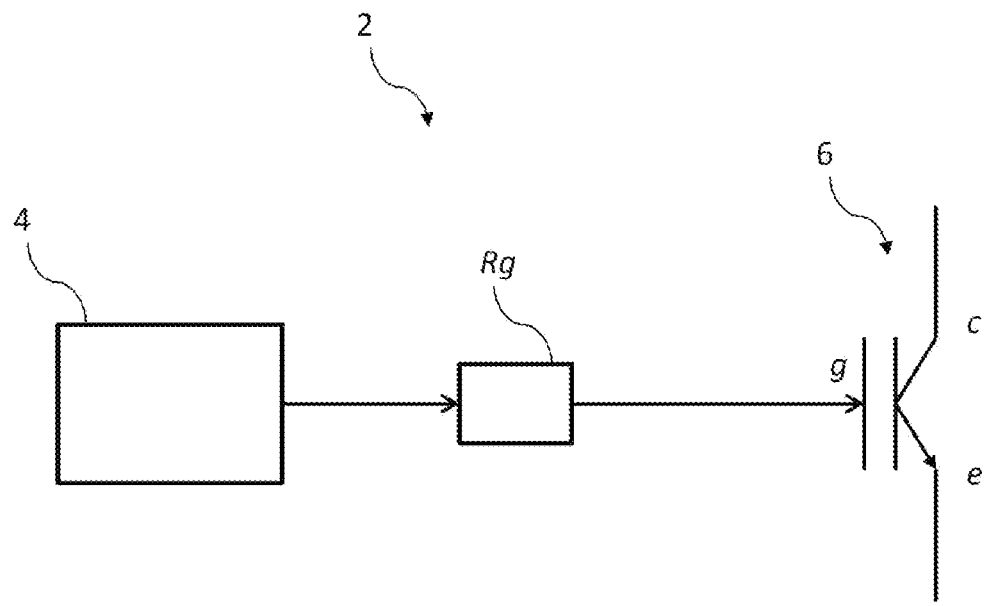
FIG. 1 shows a power stage comprising a driver and a power transistor according to the prior art.
Figure 2:
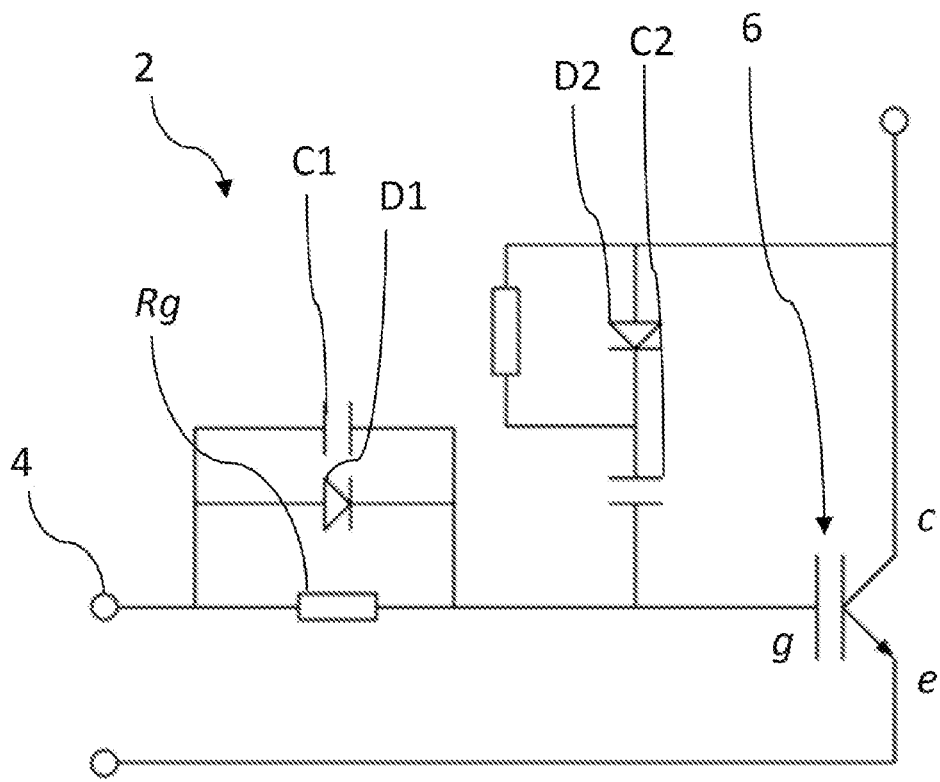
FIG. 2 shows the power stage comprising the driver, the power transistor and a control circuit when the power transistor according to the prior art turns off.

The current thus passes through the first signal transistor T10 and emerges via the base $b_{T10}$ and the collector $c_{T10}$ so as to head for the first signal capacitor C10 and for the gate g' of the power transistor 60, respectively. Now, as a reminder, the circuit for compensating for turn-on initialization delays 82 is positioned in parallel with the gate resistor Rg' as shown in FIG. 3, and the circuit for compensating for turn-on initialization delays 82 thus allows the current from the driver 40 to be redirected so as to divert the current from the gate resistor Rg' during the charging of the first signal capacitor C10. Moreover, the equivalent resistance formed by the association of the gate resistor Rg' and the circuit for compensating for turn-on initialization delays 82 has a resistance to the current that is lower than the single resistor of the gate Rg', allowing more current to be provided from the driver 40 to the power transistor 60. Consequently, the gate g' of the power transistor 60 receives more current from the driver 40 and thus allows turn-off of the power transistor to be initialized in less time compared to a configuration as shown in FIGS. 1 and 2.

This current surge and redirection of the current towards the circuit for compensating for turn-on initialization delays 82 and towards the gate g' of the power transistor 60 stops once the first signal capacitor C10 is fully charged. Moreover, we can observe that, advantageously, when the first signal capacitor C10 is fully charged and the diverted current stops, the voltage measured at the collector of the power transistor Vc is a voltage equivalent to 10% of the maximum voltage at the collector Vcmax. Thus, the power transistor turns off in less time.

Moreover, the first signal diode D10, the first signal transistor T10, the first resistor R10 and the first signal capacitor C10 are low-level components, that is to say simple commercially available electronic components. By way of illustration, the first signal diode D10 is a 1 A/50V signal diode, the first signal transistor T10 is a 1 A/50V PNP bipolar signal transistor, the first resistor R10 is a 10 kΩ¼W 50V low-level resistor or the first signal capacitor C10 is a 1 nF/50V low-level capacitor. Thus, the circuit for compensating for turn-on initialization delays 82 also has the advantage of being a circuit that is simple to implement.

As a variant, the first signal transistor T10 is a P-channel MOSFET transistor. Consequently, the circuit for compensating for turn-on initialization delays 82 is activated with a lag. This is because, if a MOSFET field effect transistor is used, the range of operation of this type of transistor is between 2 volts and 20 volts, whereas a PNP bipolar transistor operates in a voltage range defined between 0 volt and 20 volts. Consequently, it is necessary to operate at higher voltages between the gate g' and the emitter e'.

The first signal transistor T10 of MOSFET type comprises a source $e_{T10}$. The first signal transistor T10 comprises a gate $b_{T10}$. And the first signal transistor T10 comprises a drain $c_{T10}$ connected to the gate g' of the power transistor 60.

Figure 5:
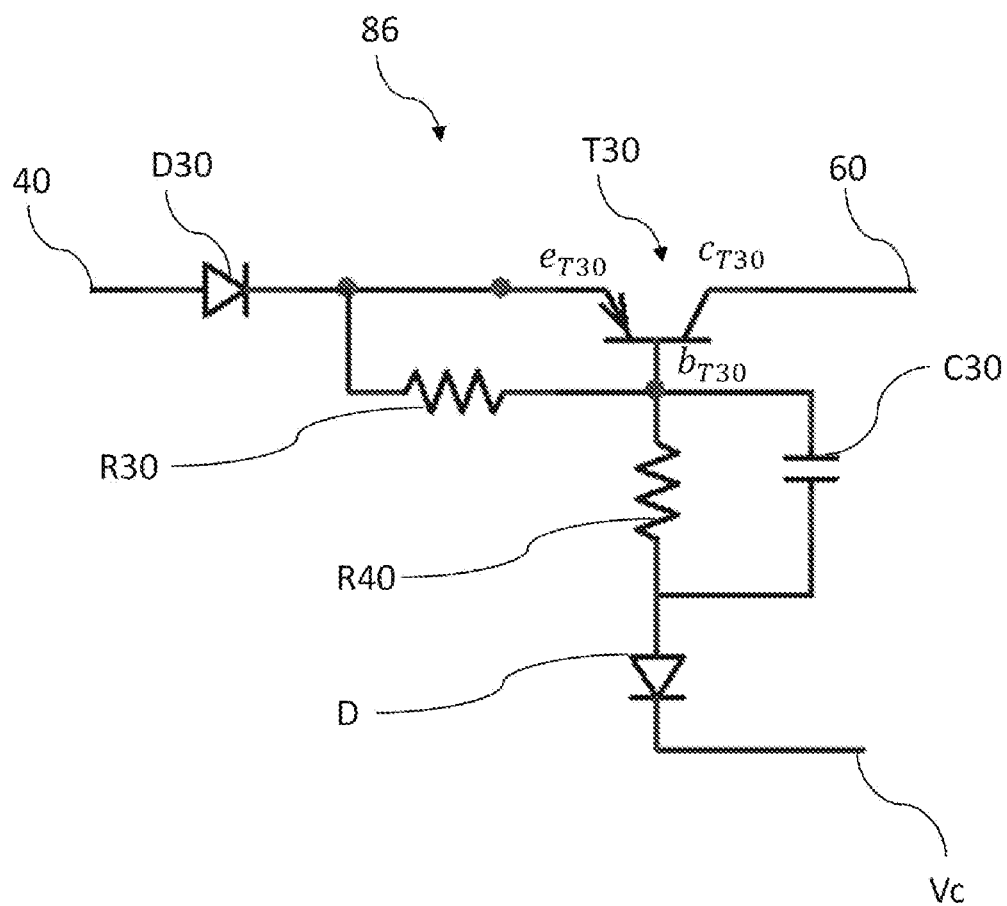
FIG. 5 shows an architecture for a circuit for compensating for delays that is configured to divert the current from the resistor Rg when the power transistor is close to the saturated state.

FIG. 5 shows the circuit for compensating for delays 86 related to the charging and/or discharging of the power transistor 60. The circuit for compensating for delays 86 comprises a third signal diode D30 configured to receive, by way of its anode, the control signal from the driver 40. This is because the circuit for compensating for delays 86 is positioned in parallel with the circuit for compensating for turn-on initialization delays 82 and with the gate resistor Rg'.

The circuit for compensating for delays 86 comprises a third signal transistor T30 connected to the cathode of the third signal diode D30 via an emitter of the third signal transistor $e_{T30}$. The third signal transistor T30 also comprises a base $b_{T30}$ and a collector $C_{T30}$ connected to the gate g' of the power transistor 60.

Moreover, the circuit for compensating for delays 86 comprises a third resistor R30 connected to the base $b_{T30}$ of the third signal transistor T30 and to the emitter $e_{T30}$ of the third signal transistor so as to be in parallel with the emitter $e_{T30}$ of the third signal transistor T30 and a diode D connected, by way of its cathode, to the collector of the power transistor 60 and, by way of its anode, to the base $b_{T30}$ of the third signal transistor T30 via a third signal capacitor C30 and a fourth resistor R40, the third signal capacitor C30 and the fourth resistor R40 being positioned in parallel with one another.

Figure 7:
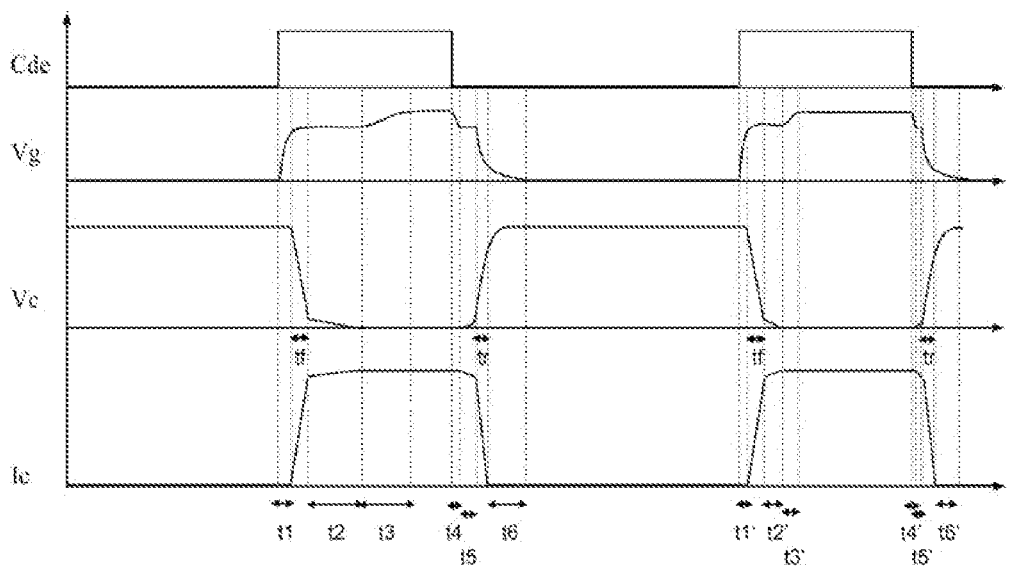
FIG. 7 shows a timing diagram comparing the delays of a power transistor in response to a control according to the prior art and the delays of a power transistor in response to a control according to the invention.

Moreover, the diode D can be used to provide information concerning when the power transistor 60 is in a saturation state. This is because the physical characteristics of the diode D, which are outlined below, allow the diode D to turn on when the power transistor 60 is saturated. Consequently, as the diode D is on, a current then flows between the base $b_{T30}$ of the third signal transistor T30 and the emitter $e_{T30}$ of the third signal transistor T30, allowing the diversion of the current vis-à-vis the resistor Rg of the power transistor 60 to be observed and thus causing a rapid increase in the voltage at the gate Vg, which can be interpreted as a decrease in the times t2' and t5' compared to the times t2 and t5, as shown in FIG. 7.

In a similar manner to FIG. 4, the third signal capacitor C30 can be used to produce a redirection of the current towards the third signal transistor T30 in order to divert the current from the gate resistor Rg' when the power transistor 60 is saturated or desaturated.

More specifically, in response to the control signal provided by the driver 40, the voltage at the gate needs a minimum time in order to develop, that is to say to increase in the event of a control in order to observe the saturation of the power transistor or to decrease in the event of a control in order to observe a desaturation of the power transistor. These times are represented by the times t2, for the case of a control for saturating the power transistor, and t5, for the case of a control for desaturating the power transistor.

This current surge and redirection of the current towards the circuit for compensating for delays 86 and towards the gate g' of the power transistor 60 can advantageously be used to more rapidly see an increase, or decrease, in the voltage at the gate g' of the power transistor 60, thus reducing the times t2, or t5.

This current surge and redirection of the current towards the circuit for compensating for delays 86 and towards the gate g' of the power transistor 60 stops once the third signal capacitor C30 is fully charged. Moreover, we can observe that, advantageously, when the third signal capacitor C30 is fully charged and the diverted current stops, the voltage measured at the gate g' of the power transistor 60 is a voltage equivalent to the control signal from the driver 40. Thus, the saturation or desaturation of the power transistor, depending on the control provided by the driver 40, is produced in a shorter time.

Moreover, the third signal diode D30, the third signal transistor T30, the third resistor R30, the fourth resistor R40 and the third signal capacitor C30 are low-level components, that is to say simple commercially available electronic components. By way of illustration, the third signal diode D30 is a 1 A/50V signal diode, the third signal transistor T30 is a 1 A/50V PNP bipolar signal transistor, the third resistor R30 and the fourth resistor R40 are low-level ¼ W 50V 10 kΩ resistors or the third signal capacitor C30 is a low-level 1 nF/50V capacitor. In a different way, the diode D connected to the collector of the power transistor 60 needs to resist higher voltages. Therefore, the diode D can be a rapid 1 A/1000V diode.

Figure 6:
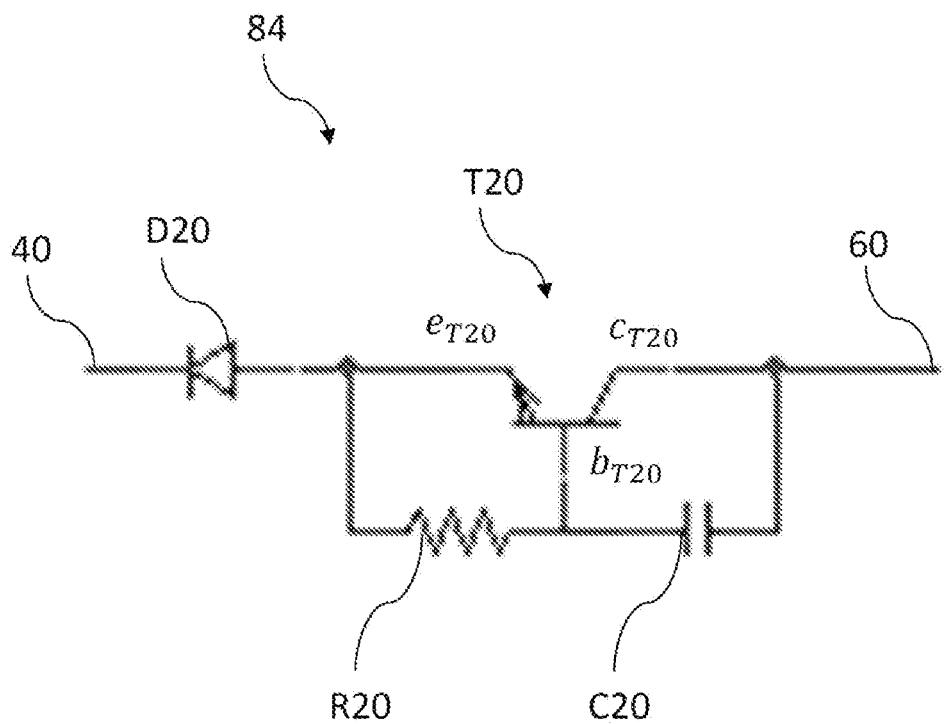
FIG. 6 shows an architecture for a circuit for compensating for turn-off initialization delays of the circuit for compensating for delays of the power transistor according to the invention.

Finally, in a similar manner to FIG. 4, and in order to limit the time t4 between the initialization of turning-on of the power transistor by the control from the driver and the increase in the voltage at the collector of the power transistor Vc and the time t6 associated with the decrease in the voltage at the gate Vg to reach the minimum value Vgmin imposed by the control from the driver 40, the circuit for compensating for turn-off initialization delays 84 comprises, as shown in FIG. 6, a second signal diode D20, the cathode of which is connected to the driver 40 and which is off vis-à-vis the direction of the current towards the gate g' of the power transistor 60.

The circuit for compensating for turn-off initialization delays 84 comprises a second signal transistor T20 connected to the anode of the second signal diode D20 via an emitter $e_{T20}$ of the second signal transistor T20. The second signal transistor T20 is an NPN bipolar transistor and also comprises a base $b_{T20}$ and a collector $c_{T20}$ connected to the gate g' of the power transistor 60.

The circuit for compensating for turn-off initialization delays 84 also comprises a second resistor R20, connected to the emitter $e_{T20}$ of the second signal transistor T20 and to the base $b_{T20}$ of the second signal transistor T20 and a second signal capacitor C20 connected to the base $b_{T20}$ of the second signal transistor T20 and to the gate g' of the power transistor 60.

Thus, when the driver 40 provides a turn-off control, a voltage differential can be observed between the voltage at the gate g' and the plates of the second signal capacitor C20. Consequently, this voltage difference allows the second signal capacitor C20 to charge, which can be used to reduce the time needed for the decrease in the voltage at the gate g' of the power transistor 60, that is to say the times t4 and t6.

Moreover, the second signal diode D20, the second signal transistor T20, the second resistor R20 and the second signal capacitor C20 are low-level components, that is to say simple commercially available electronic components. By way of illustration, the second signal diode D20 is a 1 A/50V signal diode, the second signal transistor T20 is a 1 A/50V NPN bipolar signal transistor, the second resistor R20 is a low-level ¼ W 50V 10 kΩ resistor or the second signal capacitor C20 is a low-level 1 nF/50V capacitor. Thus, the circuit for compensating for turn-off initialization delays 84 also has the advantage of being a circuit that is simple to implement.

As a variant, the second signal transistor T20 is an N-channel MOSFET transistor. Consequently, the circuit for compensating for turn-off initialization delays 84 is activated with a lag. This is because, as stated previously, if a MOSFET field effect transistor is used, the range of operation of this type of transistor is between 2 volts and 20 volts, whereas an NPN bipolar transistor operates in a voltage range defined between 0 volt and 20 volts. As such, it is necessary to operate at higher voltages between the gate g' and the emitter e'.

The MOSFET-type second signal transistor T20 comprises a drain $c_{T20}$. The second signal transistor T20 comprises a gate $b_{T20}$. And the second signal transistor T20 comprises a source $e_{T20}$.

According to one variant, the first signal diode D10 and/or the second signal diode D20 and/or third signal diode D30 are Schottky diodes or P-N junction diodes or PIN diodes.

Moreover, the circuit for compensating for delays 80 has the advantage of allowing the switching frequency of the insulated gate power transistor 60 to be increased by reducing the times t1, t2, t3, t4, t5 and t6.

The circuit for compensating for delays 80 also has the advantage of allowing conduction losses to be reduced by reducing the times t2 and t5.

Finally, FIG. 7 shows a timing diagram comparing the delays of a power transistor in response to a control according to the prior art and the delays of a power transistor in response to a control according to the invention. More specifically, the timing diagram shows a turn-on initialization for the power transistor, as submitted by a control from the driver, followed by a turn-off initialization for the power transistor, as also submitted by a control signal from the driver, first according to the prior art and then according to the invention.

Thus, the control signal Cde provided by the driver 40 takes the form of a square-wave signal, the high level of which causes a turn-on initialization for the power transistor 60 and the low level of which causes a turn-off initialization for the power transistor. In response to this control signal Cde, the voltage Vg at the gate g' increases, in the event of a turn-on initialization, or decreases, in the event of a turn-off initialization, for the power transistor. As stated previously, these initializations result in the times t1, t2, t3, t4, t5, t6. Now, as can be seen in the timing diagram, the times t1, t2, t3, t4, t5, t6 representing the delay or time for the actions mentioned previously, namely the turn-on initialization or the turn-off initialization for the power transistor, which is visible at the collector of the power transistor via the collector voltage Vc and the collector current Ic, for operation according to the prior art, are visibly longer than the times t1', t2', t3', t4', t5', t6' representing the times needed for operation with the circuit for compensating for delays 80.

Thus, by way of illustration, without compensation, the time needed for turning on the power transistor is equivalent to 456 nanoseconds and the time needed for turning off the power transistor is equivalent to 355 nanoseconds. Conversely, with the action of the circuit for compensating for delays 80, the time needed for turning on the power transistor is equivalent to 125 nanoseconds and the time needed for turning off the power transistor is equivalent to 106 nanoseconds, bringing to light a reduction in the cumulative pure delays of approximately 580 nanoseconds.

The invention claimed is:

1. A power stage comprising a power transistor and a driver, the power transistor comprising a collector (c'), a gate (g') and an emitter (e'), the power transistor being configured to change over from a saturated state to an off state and vice versa in accordance with a control from the driver, the power stage comprising a resistor (Rg') positioned between the driver and the gate (g') of the power transistor, the power stage comprising a first circuit for compensating for delays that is positioned in parallel with the resistor (Rg'), the first circuit for compensating for delays comprising:
   a circuit for compensating for turn-on initialization delays, which is configured to divert a current from the resistor (Rg') when a saturation of the power transistor is initialized,
   a circuit for compensating for turn-off initialization delays, which is configured to divert the current from the resistor (Rg') when a switching-off of the power transistor is initialized, and
   a second circuit for compensating for delays that is configured to divert the current from the resistor (Rg') when the power transistor is close to the saturated state;
   wherein the circuit for compensating for turn-on initialization delays comprises:
   a first signal diode (D10) configured to receive by way of its anode a control signal from the driver,
   a first signal transistor (T10) connected to the cathode of the signal diode (D10) via an emitter or a source ($e_{T10}$) of the first signal transistor (T10), the first signal transistor (T10) comprising a base or a gate ($b_{T10}$), and the first signal transistor comprising a collector or a drain ($c_{T10}$) connected to the gate (g') of the power transistor,
   a first resistor (R10), connected to the emitter or to the source ($e_{T10}$) of the first signal transistor (T10), and connected to the base or to the gate ($b_{T10}$) of the first signal transistor (T10), and
   a first signal capacitor (C10) connected to the base or to the gate ($b_{T10}$) of the first signal transistor (T10), and to the gate (g') of the power transistor.

2. The power stage according to claim 1, wherein the first signal transistor (T10) is a PNP bipolar transistor.

3. The power stage according to claim 1, wherein the first signal transistor (T10) is a P-channel MOSFET transistor.

4. The power stage according to claim 1, wherein the circuit for compensating for turn-off initialization delays comprises:
   a second signal transistor (T20) connected to the gate (g') of the power transistor via a collector or a drain ($c_{T20}$) of the second signal transistor (T20), the second signal transistor (T20) comprising a base or a gate ($b_{T20}$) and the second signal transistor (T20) comprising an emitter or a source ($e_{T20}$),
   a second signal diode (D20) connected by way of its cathode to the driver and connected by way of its anode to the emitter or to the source ($e_{T20}$) of the second signal transistor (T20),
   a second resistor (R20), connected to the emitter or to the source ($e_{T20}$) of the second signal transistor (T20) and connected to the base or to the gate ($b_{T20}$) of the second signal transistor (T20),
   a second signal capacitor (C20) connected to the gate (g') of the power transistor and connected to the base or to the gate ($b_{T20}$) of the second signal transistor (T20).

5. The power stage according to claim 4, wherein the second power transistor (T20) is an NPN bipolar transistor.

6. The power stage according to claim 4, wherein the second power transistor (T20) is an N-channel MOSFET transistor.

7. The power stage according to claim 1, wherein the second circuit for compensating for delays that is configured to divert the current from the resistor (Rg') when the power transistor is close to the saturated state comprises:
- a third signal diode (D30) configured to receive by way of its anode the control signal from the driver,
- a third signal transistor (T30) connected to the cathode of the third signal diode (D30) via an emitter ($e_{T30}$) of the third signal transistor (T30), the third signal transistor (T30) comprising a base ($b_{T30}$) and a collector ($c_{T30}$) connected to the gate (g') of the power transistor,
- a third resistor (R30) connected to the base ($b_{T30}$) of the third signal transistor (T30) and to the emitter ($e_{T30}$) of the third signal transistor (T30), and
- a diode (D) connected by way of its cathode to the collector (c') of the power transistor and by way of its anode to the base ($b_{T30}$) of the third signal transistor (T30) via a third signal capacitor (C30) and a fourth resistor (R40), the third signal capacitor (C30) and the fourth resistor (R40) being positioned in parallel with one another.

\* \* \* \* \*